United States Patent
Kim et al.

(10) Patent No.: US 9,479,133 B2
(45) Date of Patent: Oct. 25, 2016

(54) POWER DETECTION CIRCUIT AND RF SIGNAL AMPLIFICATION CIRCUIT HAVING THE SAME

(71) Applicant: SAMSUNG ELECTRO-MECHANICS CO., LTD., Suwon-si, Gyeonggi-do (KR)

(72) Inventors: Ki Joong Kim, Suwon-si (KR); Nam Heung Kim, Suwon-si (KR); Young Jean Song, Suwon-si (KR); Myeong Woo Han, Suwon-si (KR); Jun Goo Won, Suwon-si (KR); Iizuka Shinichi, Suwon-si (KR); Youn Suk Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 73 days.

(21) Appl. No.: 14/452,138

(22) Filed: Aug. 5, 2014

(65) Prior Publication Data

US 2015/0042405 A1    Feb. 12, 2015

(30) Foreign Application Priority Data

Aug. 6, 2013    (KR) .................. 10-2013-0093065

(51) Int. Cl.
    H03G 3/20      (2006.01)
    H03G 3/30      (2006.01)
    H03F 3/21      (2006.01)
    H03F 1/56      (2006.01)
    H03F 3/191     (2006.01)

(52) U.S. Cl.
    CPC ............ *H03G 3/3042* (2013.01); *H03F 1/565* (2013.01); *H03F 3/191* (2013.01); *H03F 3/21* (2013.01); *H03F 2200/105* (2013.01); *H03F 2200/318* (2013.01); *H03F 2200/393* (2013.01); *H03F 2200/451* (2013.01); *H03F 2200/465* (2013.01); *H03F 2200/99* (2013.01); *H03G 3/20* (2013.01)

(58) Field of Classification Search
    CPC ............ H03G 3/3042; H03G 3/3036; H03G 3/3047; H03F 3/19; H03F 2200/462; H03F 3/191; H03F 1/56; H03F 1/565; H03F 2200/372; H03F 200/222

USPC .......................... 330/140, 302, 277
    See application file for complete search history.

(56) References Cited

U.S. PATENT DOCUMENTS

| 6,262,630 B1* | 7/2001 | Eriksson | H03G 3/3042 330/140 |
| 6,895,225 B1* | 5/2005 | Talvitie | H04B 1/18 330/302 |
| 7,733,176 B2* | 6/2010 | Magoon | H03F 1/02 330/140 |

FOREIGN PATENT DOCUMENTS

| JP | 2007-174554 A | 7/2007 |
| KR | 10-2004-0110183 A | 12/2004 |
| KR | 10-2006-0022885 A | 3/2006 |
| KR | 10-2006-0092691 A | 8/2006 |
| KR | 10-2007-0048422 A | 5/2007 |

OTHER PUBLICATIONS

Korean Patent Office issued in Korean Application No. 10-2013-0093065 dated Aug. 18, 2014.

* cited by examiner

*Primary Examiner* — Khanh V Nguyen
(74) *Attorney, Agent, or Firm* — NSIP Law

(57) ABSTRACT

The present invention relates to a power detection circuit and an RF signal amplification circuit having the same. According to an embodiment of the present invention, a power detection circuit including a coupling unit adjacent to an RF matching inductor to extract induced power; a rectification unit for rectifying the signal output from the coupling unit to output the rectified signal; a slope adjustment unit connected between an output terminal of the rectification unit and a ground and adjusting a voltage slope for power detection by changing the output signal of the output terminal of the rectification unit according to changes in internal impedance; and a smoothing unit for receiving the output signal of the output terminal of the rectification unit to smooth the received signal into a DC voltage for power detection using the voltage slope is provided. Further, an RF signal amplification circuit having the same is provided.

19 Claims, 7 Drawing Sheets

POWER DETECTION CIRCUIT AND RF SIGNAL AMPLIFICATION CIRCUIT HAVING THE SAME

CROSS-REFERENCE TO RELATED APPLICATIONS

Claim and incorporate by reference domestic priority application and foreign priority application as follows:

CROSS REFERENCE TO RELATED APPLICATION

This application claims the foreign priority benefit under 35 U.S.C. Section 119 of Korean Patent Application Serial No. 10-2013-0093065, filed Aug. 6, 2013, which is hereby incorporated by reference in its entirety into this application.

BACKGROUND OF THE INVENTION

1. Field of the Invention

The present invention relates to a power detection circuit and an RF signal amplification circuit having the same, and more particularly, to a power detection circuit that can adjust a voltage slope for power detection and an RF signal amplification circuit having the same.

2. Description of the Related Art

In general, in transmitting an RF signal, power of the RF signal amplified by an amplification circuit is detected and fed back according to the detection results to control the amount of amplification.

As a method of detecting power by extracting power from an RF signal, there is a closed loop method. The closed loop method extracts power by disposing a secondary conductor adjacent to a matching inductor of an RF signal using a coupling circuit. A sinusoidal waveform induced and extracted from the matching inductor is half-wave rectified using a diode, a ripple is removed using an RC filter, and a DC output is obtained from a voltage detection terminal.

In this power detection method, power is detected from the detected DC output using a voltage slope for power detection. At this time, system requirements are that the size of the voltage slope for power detection, that is, the slope should be satisfied, a detected voltage variation at a voltage standing wave ratio (VSWR) of 3:1 should be minimized, and a stable DC voltage should be extracted proportionally.

However, due to the diversity of characteristics and manufacturers of the systems, characteristics of the voltage slope for power detection are different according to the systems. In order to overcome this difference and meet the system requirements, the voltage slope suitable for the characteristics of each system is required, and for this, slope resistance for determining the voltage slope of each power detection circuit or device should be adjusted. Eventually, since the voltage slope is determined according to the characteristics of each system, the degree of freedom of the voltage slope is remarkably deteriorated and there is a difficulty in application to the system having different characteristics.

RELATED ART DOCUMENT

Patent Document

Patent Document 1: Japanese Patent Laid-Open Publication No. 2007-174554 (laid open on Jul. 5, 2007)

Patent Document 2: Korean Patent Laid-Open Publication No. 10-2004-0110183 (laid open on Dec. 31, 2004)

SUMMARY OF THE INVENTION

The present invention has been invented in order to overcome the above-described problems and it is, therefore, an object of the present invention to provide a technology that can improve the degree of freedom of a voltage slope and be applied to various systems by adjusting the voltage slope for power detection.

In accordance with one aspect of the present invention to achieve the object, there is provided a power detection circuit including: a coupling unit adjacent to an RF matching inductor to extract induced power; a rectification unit for rectifying the signal output from the coupling unit to output the rectified signal; a slope adjustment unit connected between an output terminal of the rectification unit and a ground and adjusting a voltage slope for power detection by changing the output signal of the output terminal of the rectification unit according to changes in internal impedance; and a smoothing unit for receiving the output signal of the output terminal of the rectification unit to smooth the received signal into a DC voltage for power detection using the voltage slope.

At this time, in an example, the slope adjustment unit may have a variable resistor structure.

Further, at this time, in another example, the slope adjustment unit may include a resistor group consisting of a plurality of resistors connected in series and a MOS transistor(s) connected in parallel to each of at least some resistors of the resistor group to vary a resistance of the resistor group.

Further, in an example, the power detection circuit may further include a biasing unit for biasing the signal output from the coupling unit to provide the biased signal to the rectification unit.

At this time, in another example, the biasing unit may include a voltage division unit for dividing a reference voltage to adjust the height of the DC voltage output from the smoothing unit; and a voltage drop unit for generating a bias voltage by dropping the voltage divided by the voltage division unit, wherein the voltage drop unit drops the an RF minimum input signal extracted by the coupling unit so that the smoothing unit output the predetermined DC voltage.

In another example, the coupling unit may include a coil adjacent to the matching inductor to extract the power induced from the matching inductor and a termination resistor connected to a termination of the coil to adjust a coupling impedance.

At this time, in accordance with another example, the coil may be formed to overlap in the vertical direction while being separated from an outer eddy conductive line of the matching inductor having an eddy structure.

Further, in another example, the power detection circuit may further include a blocking capacitor formed between the coupling unit and the rectification unit to block a DC component of the signal extracted by the coil.

Further, in accordance with an example, the power detection circuit may further include a controller for detecting the smoothed DC voltage and detecting power according to the voltage slope using the detected DC voltage.

Next, in accordance with another aspect of the present invention to achieve the object, there is provided an RF signal amplification circuit, having a power detection circuit, including: an amplification block for receiving an RF signal to amplify the RF signal; a matching block including an RF matching inductor and performing impedance matching of the RF signal amplified by the amplification block to output the impedance-matched signal; and the power detection circuit according to one of the embodiments of the above-described aspect of the present invention, which forms a coupling circuit with the RF matching inductor of the matching block and detects power by extracting power induced from the matching inductor.

At this time, in an example, the power detection circuit may further include a controller for detecting a smoothed DC voltage and detecting power according to a voltage slope using the detected DC voltage.

Further, in an example, the matching block may include a first matching inductor connected to an output terminal of the amplification block; a second matching inductor as an RF matching inductor connected to the first matching inductor and coupled to the coupling unit of the power detection circuit; and a matching capacitor connected between a ground and a node between the first and second matching inductors.

At this time, in another example, the RF signal amplification circuit may further include a filter block including a noise removal capacitor for removing high-frequency noise included in the RF signal output from the matching block and a DC removal capacitor for removing a DC component included in the RF signal to output the DC component removed signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
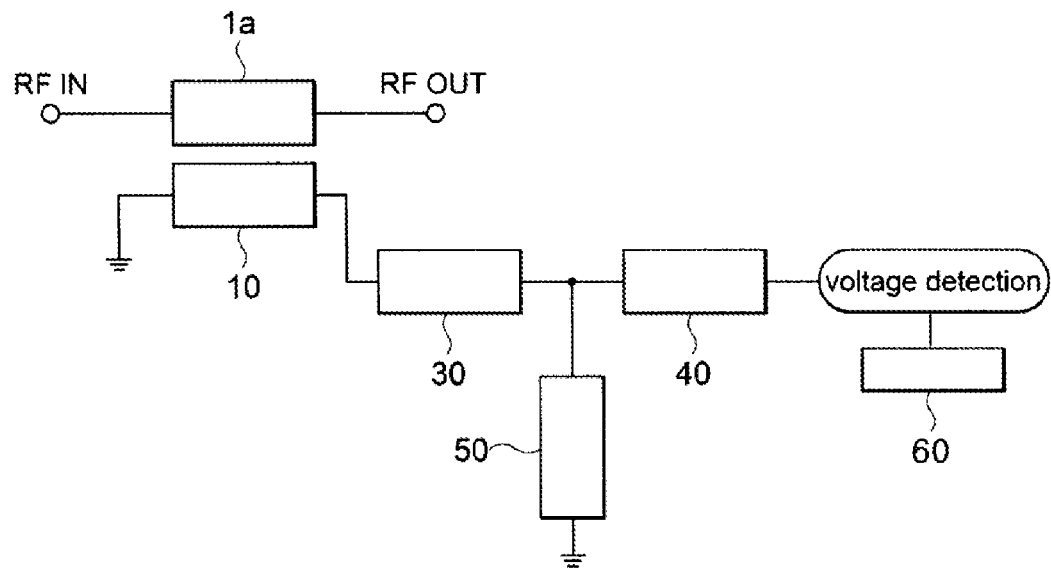
FIG. 1 is a block diagram schematically showing a power detection circuit in accordance with an embodiment of the present invention.

Embodiments of the present invention to achieve the above-described objects will be described with reference to the accompanying drawings. In this description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other elements or combination thereof.

First, a power detection circuit in accordance with one aspect of the present invention will be specifically described with reference to the drawings. At this time, the reference numeral that is not mentioned in the reference drawing may be the reference numeral that represents the same element in another drawing.

Figure 2:
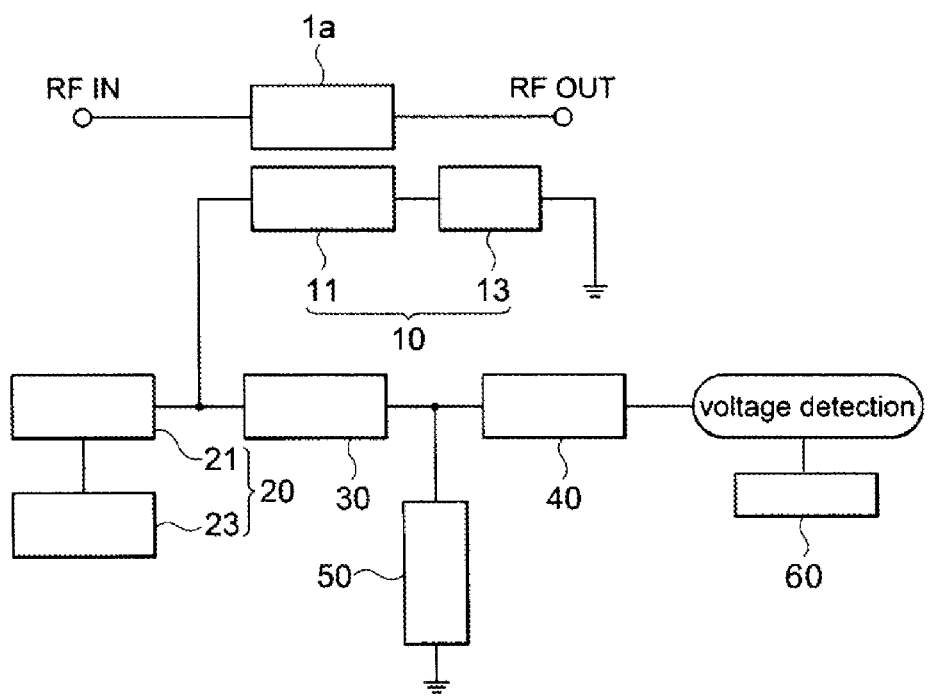
FIG. 2 is a block diagram schematically showing a power detection circuit in accordance with another embodiment of the present invention.
Figure 3:
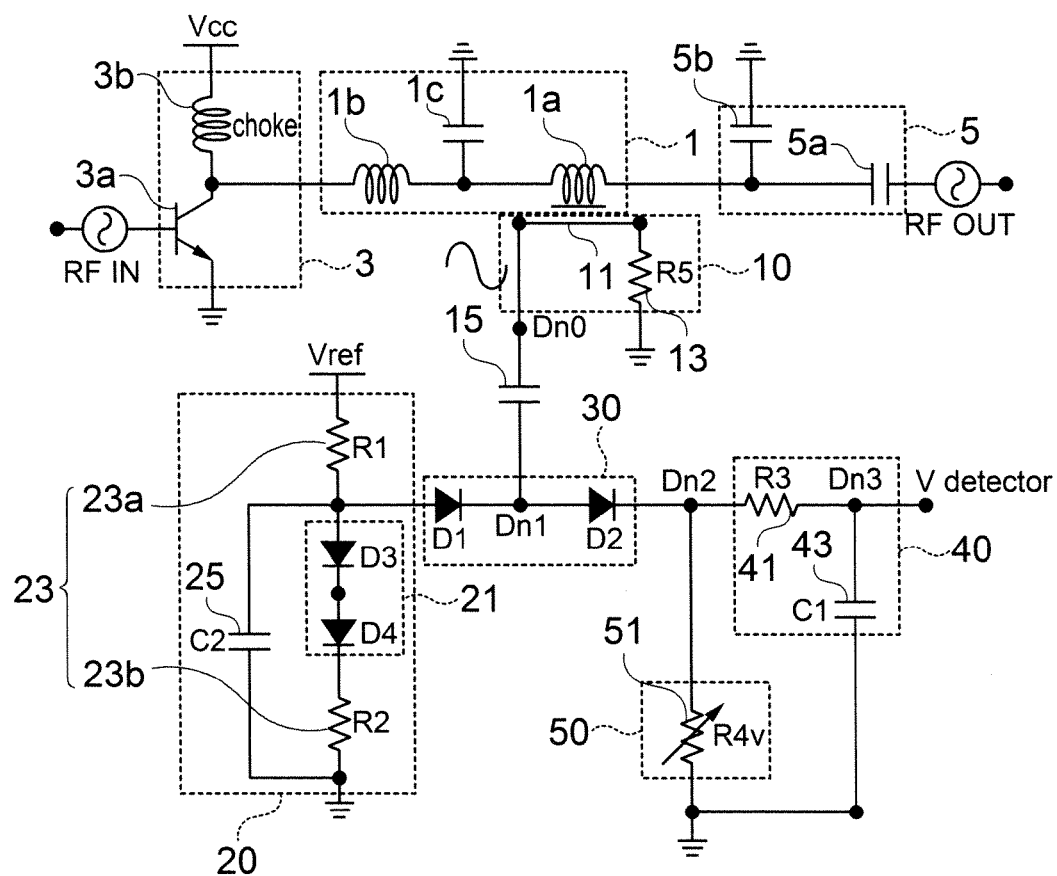
FIG. 3 is a circuit diagram schematically showing an RF signal amplification circuit having a power detection circuit in accordance with another embodiment of the present invention.
Figure 4:
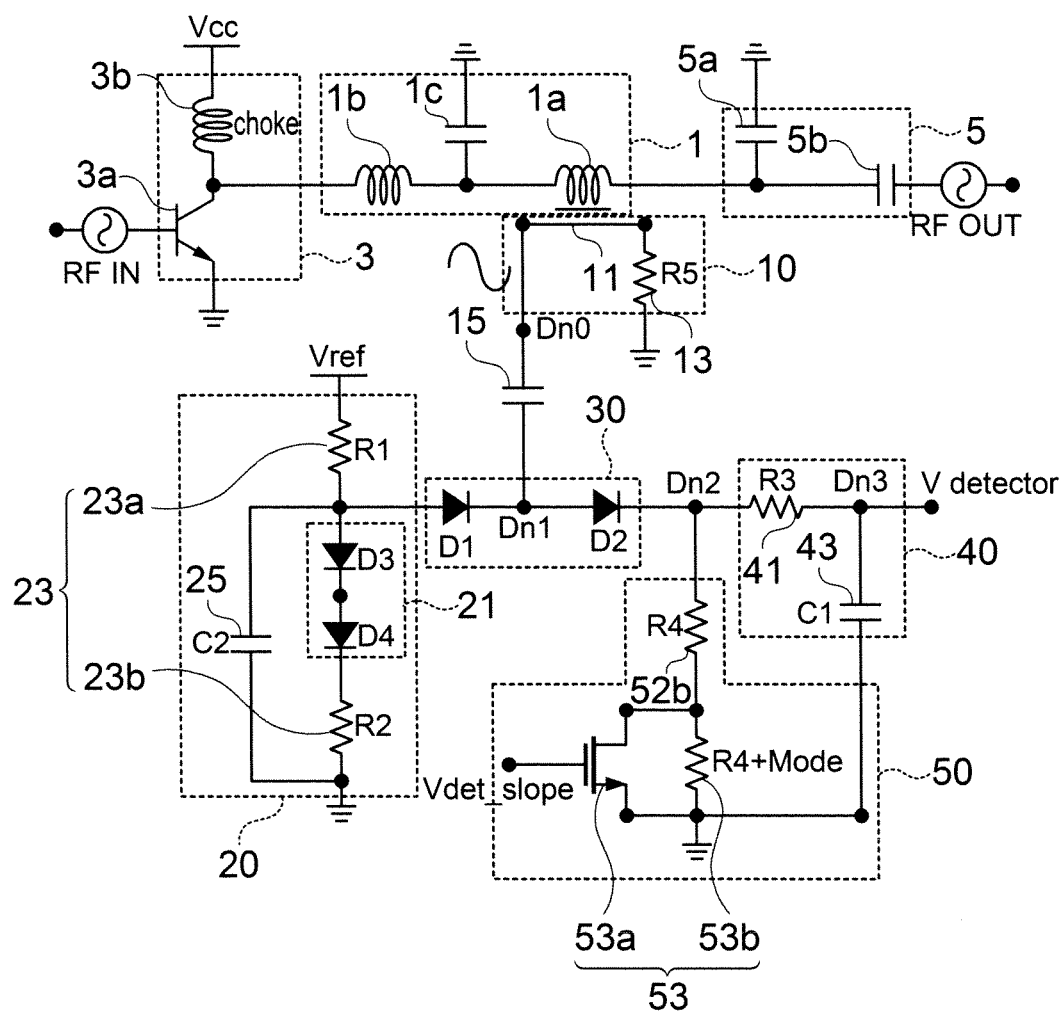
FIG. 4 is a circuit diagram schematically showing an RF signal amplification circuit having a power detection circuit in accordance with another embodiment of the present invention.
Figure 5:
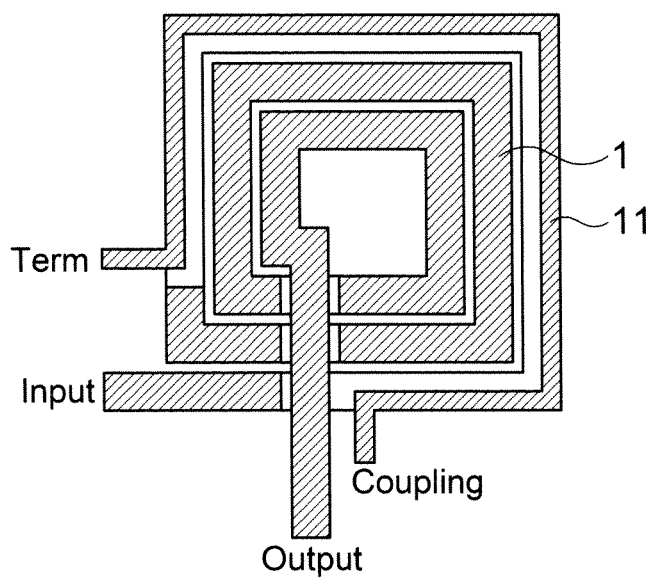
FIG. 5 is view showing a coupling structure of the power detection circuit in accordance with an embodiment of the present invention.
Figure 6A:
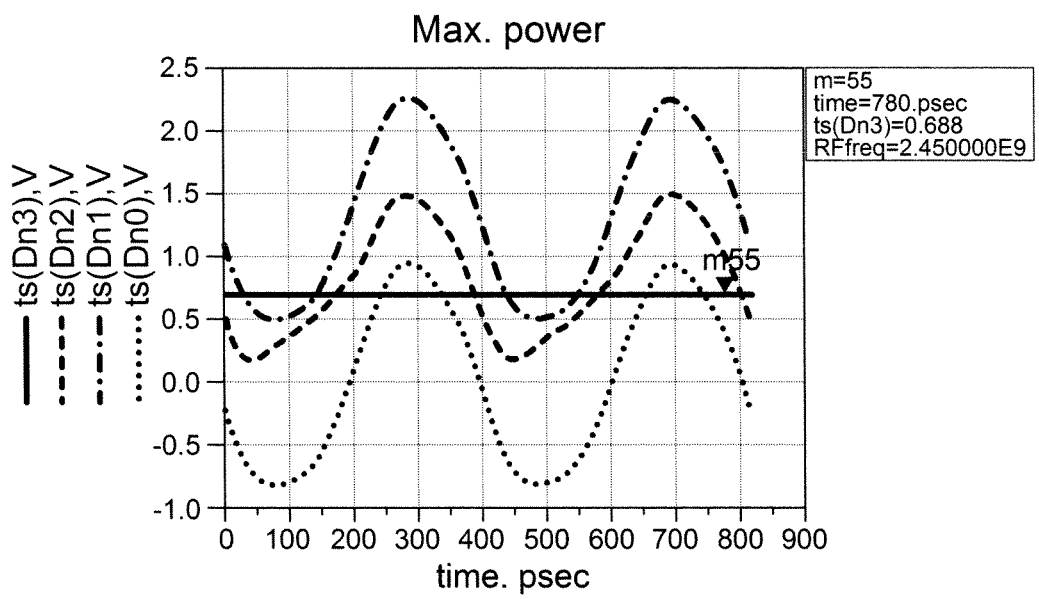
FIGS. 6a and 6b are graphs showing voltage waveforms of nodes in the power detection circuit in accordance with an embodiment of the present invention.
Figure 6B:
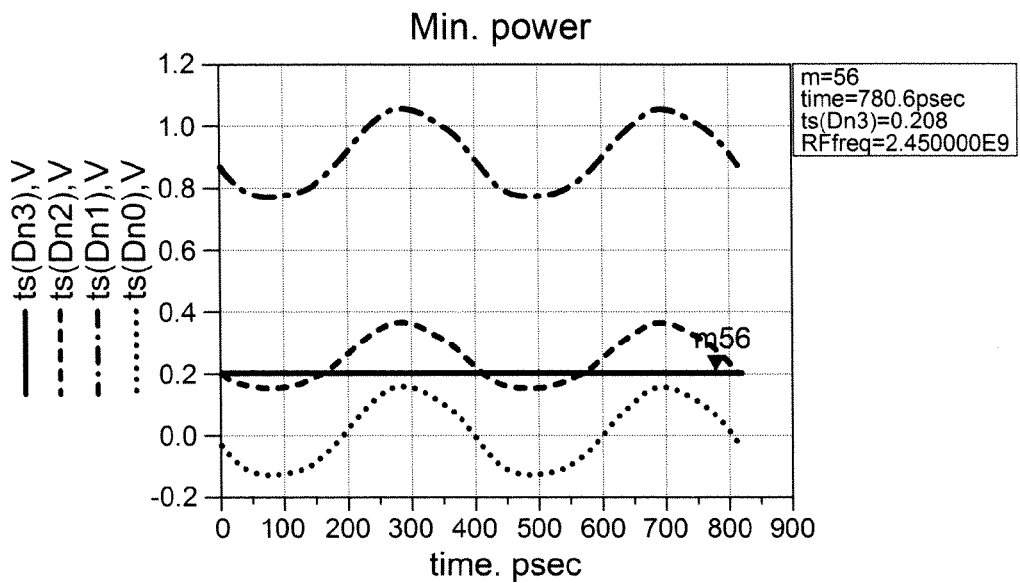
Figure 7A:
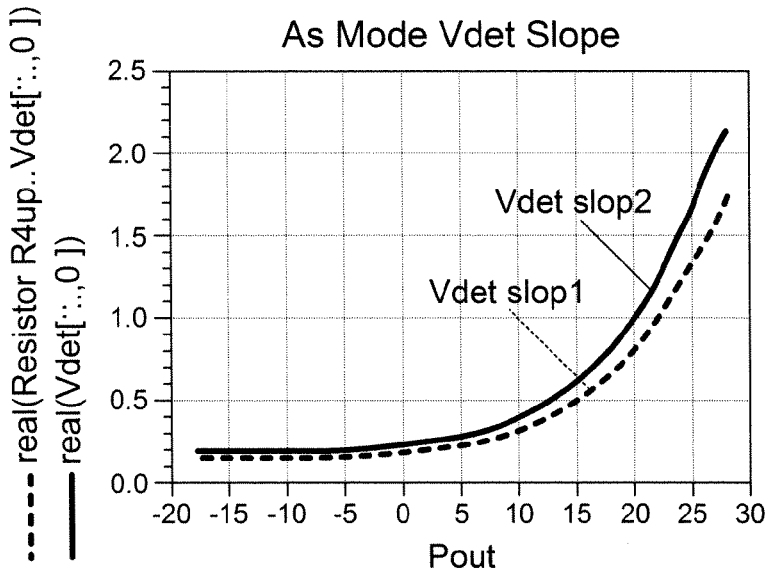
FIGS. 7a and 7b are graphs showing voltage slopes for power detection applied to the power detection circuit in accordance with an embodiment of the present invention.
Figure 7B:
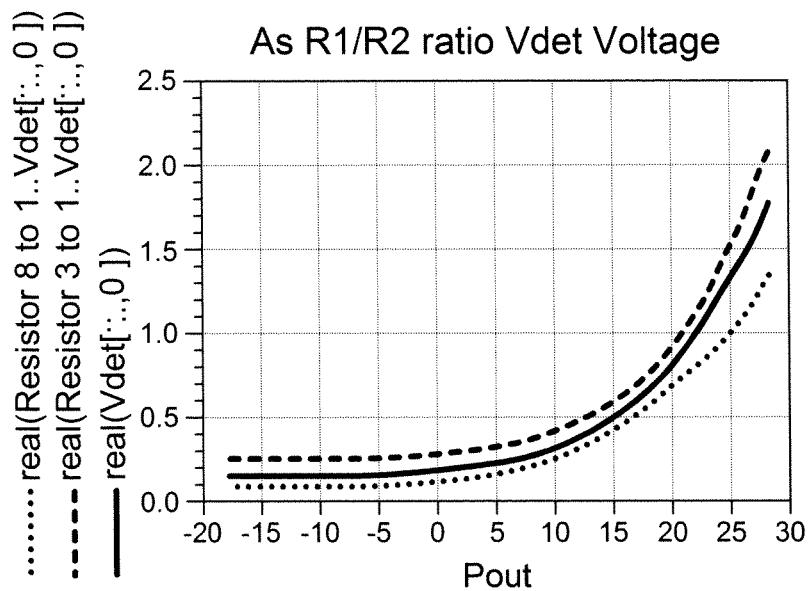
Figure 8A:
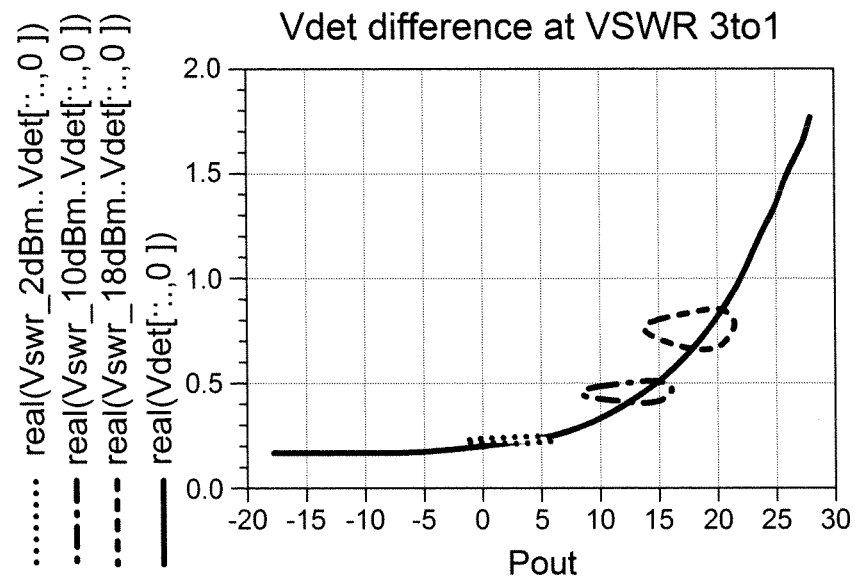
FIGS. 8a and 8b are graphs showing detected voltage variations at a VSWR of 3:1 applied to the power detection circuit in accordance with an embodiment of the present invention.
Figure 8B:
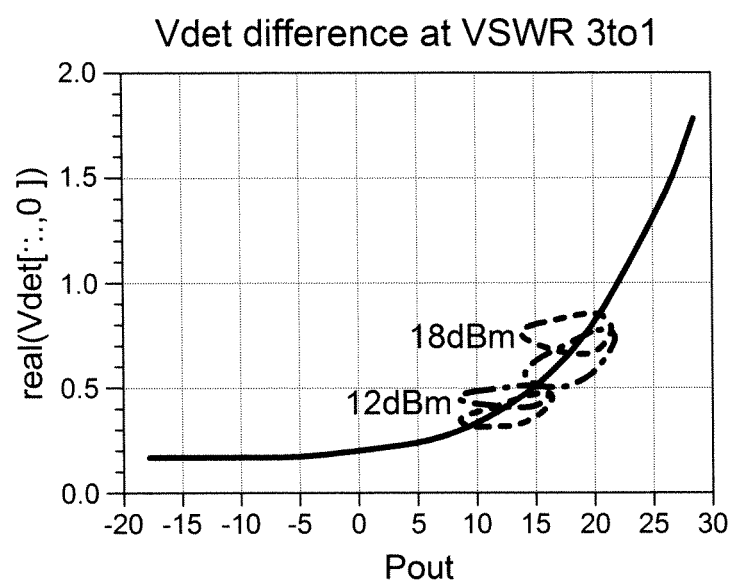

FIG. 1 is a block diagram schematically showing a power detection circuit in accordance with an embodiment of the present invention, FIG. 2 is a block diagram schematically showing a power detection circuit in accordance with another embodiment of the present invention, FIG. 3 is a circuit diagram schematically showing an RF signal amplification circuit having a power detection circuit in accordance with another embodiment of the present invention, FIG. 4 is a circuit diagram schematically showing an RF signal amplification circuit having a power detection circuit in accordance with another embodiment of the present invention, FIG. 5 is view showing a coupling structure of the power detection circuit in accordance with an embodiment of the present invention, FIGS. 6a and 6b are graphs showing voltage waveforms of nodes in the power detection circuit in accordance with an embodiment of the present invention, FIGS. 7a and 7b are graphs showing voltage slopes for power detection applied to the power detection circuit in accordance with an embodiment of the present invention, and FIGS. 8a and 8b are graphs showing detected voltage variations at a voltage standing wave ratio (VSWR) of 3:1 applied to the power detection circuit in accordance with an embodiment of the present invention.

Referring to FIGS. 1 to 4, the power detection circuit in accordance with an example includes a coupling unit 10, a rectification unit 30, a slope adjustment unit 50, and a smoothing unit 40. Further, referring to FIGS. 2 to 4, the power detection circuit in accordance with another example may further include a biasing unit 20. In addition, referring to FIGS. 3 and 4, the power detection circuit in accordance with another example may further include a blocking capacitor 15. Further, according to another example, the power detection circuit may further include a controller 60.

For example, the power detection circuit according to the present invention may be applied to a method of extracting power in a closed loop manner. Further, for example, the power detection circuit according to the present invention may be used in an amplification system that amplifies an RF signal, for example, power detection of the signal output from a power amplifier (PA) IC. That is, the power detection circuit according to the present invention may be used to extract power, for example, in a closed loop manner in the amplification system such as a WIFI PA IC.

The coupling unit 10 of the power detection circuit will be described with reference to FIGS. 1 to 5. The coupling unit 10 is disposed adjacent to an RF matching inductor 1a while being separated from the RF matching inductor 1a. At this time, the coupling unit 10 extracts power induced from the RF matching inductor 1a.

For example, referring to FIGS. 2 to 4, the coupling unit 10 may include a coil 11 and a termination resistor 13. At this time, the coil 11 is disposed adjacent to the RF matching inductor 1a while being separated from the RF matching inductor 1a and extracts the power induced from the RF matching inductor 1a. Further, the termination resistor 13 is connected to a termination of the coil 11 to adjust a coupling impedance.

FIG. 5 shows a coupling structure in which the coil 11 as a coupling conductor is coupled to the RF matching inductor 1a. For example, referring to FIG. 5, the coil 11 may be formed to overlap in the vertical direction while being separated from an outer eddy conductive line of the RF matching inductor 1a having an eddy structure. At this time, the termination resistor 13 connected to the termination of the coil 11 may extend from the termination of the coil 11 to the outer direction of the eddy structure. In FIG. 5, the length of the coil 11 conductor is maximized and the impedance of the termination resistor 13 R5 is adjusted to improve the determined directivity of the coil 11 conductor. The value of the directivity is set to satisfy −26 dB according to the resistance of the termination resistor 13 R5. For example, the coupling structure for power detection of the signal output from the PA IC may be formed as in FIG. 5.

For example, when forming the coupling structure as in FIG. 5, FIG. 8b shows characteristics of a voltage variation of the detected voltage according to the load change at a VSWR of 3:1 according to the impedance adjustment of the termination resistor 13 R5 when output power values are 12 dBm and 18 dBm. The impedance of the coupling value can be adjusted according to the termination resistor 13 R5.

Through the structure of FIG. 5, it is possible to implement a design that minimizes a VSWR load change variation according to the resistance adjustment of the termination resistor 13 R5. Generally, the occurrence of the variation due to the VSWR load change is determined by the directivity of a coupler. As two methods for improving directivity, first, there is a method of increasing the length of the coupling conductor to λ/4 according to the wavelength of a frequency, and second, there is a method of adjusting the resistance of the termination conductor to the wavelength of the frequency by varying impedance. In the embodiment of the present invention, it is possible to minimize a load variation, a requirement of the system, by adjusting the resistance of the termination resistor 13.

At this time, an example will be described with reference to FIGS. 3 and 4. The power detection circuit may further include the blocking capacitor 15. At this time, the blocking capacitor 15 is formed between the coupling unit 10 and the rectification unit 30. The blocking capacitor 15 can block a DC component of the signal induced and extracted from the RF matching inductor 1a in the coil 11.

Next, referring to FIGS. 1 to 4, the rectification unit 30 of the power detection circuit rectifies the signal output from the coupling unit 10 to output the rectified signal. For example, the rectification unit 30 may include diodes to rectify the signal output from the coupling unit 10. For example, the rectification unit 30 may include rectifier diodes D1 and D2. Referring to FIGS. 3 and 4, the rectifier diodes D1 and D2 rectify the signal output from the coupling unit 10 to output the rectified signal to the smoothing unit 40, for example, an RC filter. Referring to FIGS. 3 and 4, the rectifier diode D1 blocks the signal output from the coupling unit 10 from flowing backward to the biasing unit 20 and also drops a bias voltage supplied from the biasing unit 20. The rectifier diode D2 drops the signal which is output from the coupling unit 10 and biased by the bias voltage.

Next, the slope adjustment unit 50 will be specifically described with reference to FIGS. 1 to 4. The slope adjustment unit 50 is connected between an output terminal of the rectification unit 30 and a ground. At this time, the slope adjustment unit 50 changes an output signal of the output terminal of the rectification unit 30 according to changes in internal impedance. A voltage slope for power detection is adjusted according to the changes in the internal impedance of the slope adjustment unit 50.

At this time, referring to FIGS. 3 and 4, in an example, the slope adjustment unit 50 may have a variable resistor structure. For example, as shown in FIG. 3, the slope adjustment unit 50 may be formed of a variable resistor 51. Otherwise, as shown in FIG. 4, the variable resistor structure may include a plurality of resistors 52b and 53b and a MOS transistor(s) 53a connected in parallel to each of at least some resistors 53b. Referring to FIG. 4, the slope adjustment unit 50 may include a resistor group and the MOS transistor(s) 53a. At this time, the resistor group is formed by connecting the plurality of resistors 52b and 53b in series. At this time, the MOS transistor(s) 53b is connected to each of the at least some resistors 53b of the resistor group to vary the resistance of the resistor group according to the ON-OFF operations of the MOS transistor(s) 53a. In FIG. 4, the MOS transistor(s) 53a and the resistor(s) 53b connected in parallel to the MOS transistor(s) 53a form a variable resistor group 53, and the resistor(s), which is not connected in parallel to the MOS transistor(s) 53a, forms the basic resistor(s) 52b. At this time, the higher the resistance of the variable resistor group 53, the higher the impedance resistance of the slope adjustment unit 50. Thus, the voltage slope for power detection, that is, the slope is increased. Accordingly, the voltage slope for power detection can be variously adjusted in one power detection circuit or power detection device. The voltage slope shown in FIG. 7a is determined by the resistance of the variable resistor 51 shown in FIG. 3 or the variable resistor group 53 or the basic resistor 52b shown in FIG. 4. As the resistance of the variable resistor 51 or the variable resistor group 53 increases, the voltage slope, that is, the slope of the graph increases. As the resistance of the variable resistor 51 or the variable resistor group 53 decreases, the voltage slope, that is, the slope of the graph decreases. Accordingly, it is possible to improve the degree of freedom in design of the voltage slope for power detection. Further, it is possible to satisfy the performance of the RF amplification system including the power detection circuit according to the increase in the degree of freedom in design of the voltage slope.

When designing the RF amplification circuit including the power detection circuit, various voltage slopes for power detection are intended according to the characteristics of the system, for example, the PA IC. In the prior art, the resistance of the slope adjustment unit 50 of the power detection circuit should be different in order to implement the voltage slope that meets the reference according to the characteristics of various products. However, according to the present embodiment, it is possible to change or adjust the voltage slope for power detection according to the characteristics of the various system products to the reference in one power detection circuit or power detection device by adjusting the resistance of the slope adjustment unit 50, for example, the impedance of the variable resistor group 53. Accordingly, in manufacturing the power detection device, there is no need to manufacture various power detection devices having different resistors, which form the slope adjustment unit 50, according to the characteristics of the various products manufactured by system manufacturers, for example, the PA IC. That is, according to the embodiment of the present invention, it is possible to adjust the voltage slope by changing the impedance, that is, the resistance of the slope adjustment unit 50 to have the voltage slope for power detection suitable for the characteristics of each of the various systems, thus satisfying the voltage slope characteristics of the various systems in one power detection device. For example, at this time, in the structure like FIG. 4, it is possible to implement the voltage slope for power detection suitable for the characteristics of the system by selectively connecting a port, which is connected to a gate of the MOS transistor(s) 53*a*, to VDD or GND of the system, for example, the PA IC to adjust the resistance of the variable resistor group 53 of FIG. 4.

Continuously, the smoothing unit 40 will be described with reference to FIGS. 1 to 4. The smoothing unit 40 receives the output signal of the output terminal of the rectification unit 30 to smooth the received signal into a DC voltage for power detection using the voltage slope. Referring to FIGS. 3 and 4, the smoothing unit 40 may consist of an RC filter including a resistor R3 41 and a capacitor C1 43. The RC filter removes a ripple component from the output signal of the rectification unit 30 and smoothes the output signal of the rectification unit 30 to output the DC voltage. At this time, for example, the DC voltage may be detected by the controller 60, and power may be detected from the detected DC voltage through the voltage slope for power detection.

Further, an example of the power detection circuit will be described with reference to FIGS. 2 to 4. Referring to FIGS. 2 to 4, the power detection circuit according to an example may further include the biasing unit 20. At this time, the biasing unit 20 may bias the signal output from the coupling unit 10 to provide the biased signal to the rectification unit 30. For example, the biasing unit 20 may bias the AC signal output from the coupling unit 10 to allow the AC signal to have a positive value.

For example, the biasing unit 20 may include a voltage division unit 23 and a voltage drop unit 21. The voltage division unit 23 divides a reference voltage Vref to adjust the height of the DC voltage output from the smoothing unit 40. Referring to FIGS. 3 and 4, the voltage division unit 23 may consist of a first resistor R1 23*a* and a second resistor R2 23*b*. The reference voltage Vref is supplied from the outside of the power detection circuit, for example, the system using the power detection circuit such as the PA IC. For example, when the reference voltage is 2.9V, the reference voltage is dropped by diodes D3 and D4 which form the voltage drop unit 21, and the voltage division unit 23 divides the dropped voltage from the reference voltage to output the divided voltage as the bias voltage.

Referring to FIG. 7*b*, it is possible to adjust a detected voltage average value of the voltage slope for power detection upward or downward according to the ratio of the first resistor 23*a* and the second resistor 23*b* of the voltage division unit 23, that is, the R1/R2 resistance ratio. Therefore, it is possible to satisfy the reference of the voltage slope for power detection of the system using the power detection circuit, for example, the PA IC by adjusting the ratio of the first resistor 23*a* and the second resistor 23*b* of the voltage division unit 23, that is, the R1/R2 resistance ratio, thus satisfying the performance of the system.

Continuously, referring to FIGS. 3 and 4, the voltage drop unit 21 drops the voltage divided by the voltage division unit 23 to generate the bias voltage. At this time, the voltage drop unit 21 drops the RF minimum input signal extracted by the coupling unit 10 so that the smoothing unit 40 should output the predetermined DC voltage. It is possible to obtain a constant voltage by the voltage drop of the diodes of the voltage drop unit 21. Referring to FIGS. 3 and 4, the diodes D3 and D4 of the voltage drop unit 21 are disposed between the first resistor 23*a* and the second resistor 23*b* of the voltage division unit 23 and drop the voltage so that the RC filter can output the predetermined DC voltage for the RF minimum input signal. The diodes D3 and D4 of the voltage drop unit 21, for example, cause a voltage drop of 0.64V and delicately control the bias voltage value for biasing the signal output from the coupling unit 10 by the size adjustment. Referring to FIG. 7*a*, according to the bias voltage generated by the voltage drop of the voltage drop unit 21, even when the RF minimum input signal is input to the power detection circuit and low output, it is possible to obtain, for example, a DC voltage of greater than 0.2V.

For example, according to the embodiment of the present invention, it is possible to detect a voltage from 0.2V to 0.7V, which is a performance operating region of the power detection circuit in the system such as the PA IC using the rectifier diode D2, the RC filter of the smoothing unit 40, and the diodes D3 and D4 of the voltage drop unit 21.

Further, referring to FIGS. 3 and 4, the biasing unit 20 may further include a capacitor 25 connected in parallel to a serial structure of the second resistor 23*b* of the voltage division unit 23 and the diodes D3 and D4 of the voltage drop unit 21. The reference voltage Vref of the biasing unit 20 is to apply a positive voltage to the diode D2 of the rectification unit 30 which is a half-wave rectifier circuit. At this time, the diodes D3 and D4 of the voltage drop unit 31 may be connected in series to apply a positive voltage to the diode D2 of the rectification unit 30 and rectify the voltage. At this time, the capacitor C2 25 performs a role of a bypass capacitor of a biasing unit 20-side power supply, for example, a reference voltage Vref-side power supply. At this time, an RF abnormal signal may be removed by the bypass capacitor C2 25.

Further, the power detection circuit according to another example will be described. At this time, the power detection circuit according to an example may further include the controller 60. The controller 60 detects the smoothed DC voltage and detects power according to the voltage slope using the detected DC voltage.

The operation of the power detection circuit according to the embodiment of the present invention will be described with reference to FIGS. 6*a* and 6*b*. FIGS. 6*a* and 6*b* show signal waveforms of nodes from Dn0 to Dn3 in the embodiment like FIG. 3 or 4. FIG. 6*a* shows voltage conversion results at the time of the maximum input of the RF signal to the power detection circuit, that is, the maximum output of the power detection circuit, and FIG. 6*b* shows voltage conversion waveforms at the time of the minimum input of the RF signal to the power detection circuit, that is, the minimum output of the power detection circuit. Referring to FIGS. 6*a* and 6*b*, a voltage between the minimum output and the maximum output is 0.2V to 0.7V that satisfies the performance of the voltage slope for power detection. Referring to FIGS. 6*a* and 6*b*, a waveform of Dn0 is a sine wave, which is an RF signal waveform, and an AC signal having the range from a negative value to a positive value. A waveform of Dn1 is extracted as a positive sine wave by the bias voltage value dropped by the rectifier diode D1 and the diodes D3 and D4 of the voltage drop unit 21. Further, a waveform of Dn2 is extracted as a positive sine wave that is reduced than Dn1 by the voltage drop by the rectifier diode D2. A waveform of Dn3 shows DC voltage characteristics by the filtering of the smoothing unit 40, that is, the resistor R3 41 and the capacitor C1 43 of the RC filter.

FIG. 8a is a graph showing a variation of the detected voltage according to the load variation at a VSWR of 3:1. It is possible to exhibit the characteristics of the coupling structure with the minimized variation according to the load variation by adjusting the voltage slope for power detection according to the adjustment of the slope adjustment unit 50 in accordance with the embodiment of the present invention. Accordingly, it is possible to satisfy the performance of the system to which the power detection circuit is applied.

Next, an RF signal amplification circuit, having a power detection circuit, according to another aspect of the present invention will be specifically described with reference to the drawings. At this time, the embodiments of the power detection circuit in accordance with the above-described aspect of the present invention and FIGS. 1, 2, 5 to 8b will be referenced. Thus, repeated descriptions may be omitted.

FIG. 3 is a circuit diagram schematically showing an RF signal amplification circuit having a power detection circuit in accordance with another embodiment of the present invention, and FIG. 4 is a circuit diagram schematically showing an RF signal amplification circuit having a power detection circuit in accordance with another embodiment of the present invention.

Referring to FIGS. 3 and 4, the RF signal amplification circuit, having a power detection circuit, according to an example includes an amplification block 3, a matching block 1, and a power detection circuit. Further, referring to FIGS. 3 and 4, the RF signal amplification circuit, having a power detection circuit, according to another example may further include a filter block 5.

For example, the RF signal amplification circuit according to the present invention may be applied to a method of extracting power in a closed loop manner.

For example, the RF signal amplification circuit according to the present invention may be applied to a PA IC, for example, a WIFI PA IC. For example, the RF signal amplification circuit according to the present invention may be applied to a WIFI 2.4 GHz PA IC.

The amplification block 3 of the RF signal amplification circuit having a power detection circuit will be described with reference to FIGS. 3 and 4. At this time, the amplification block 3 receives an RF signal to amplify the RF signal. For example, referring to FIGS. 3 and 4, the amplification block 3 may amplify a power voltage Vcc introduced into an amplifier 3a through a choke coil 3b according to the input of the RF signal.

Next, referring to FIGS. 3 and 4, the matching block 1 of the RF signal amplification circuit performs impedance matching of the RF signal amplified by the amplification block 3 to output the impedance-matched signal. At this time, the matching block 1 includes an RF matching inductor 1a.

For example, referring to FIGS. 3 and 4, the matching block 1 may include a first matching inductor 1b, a second matching inductor 1a, and a matching capacitor 1c. The first matching inductor 1b is connected to an output terminal of the amplification block 3, and the second matching inductor 1a is connected to the first matching inductor 1b. The second matching inductor 1a is the RF matching inductor 1a coupled to a coupling unit 10 of the power detection circuit. The matching capacitor 1c is connected between a node between the first and second matching inductors 1b and 1a and a ground. Although FIGS. 3 and 4 show that the matching block 1 has a T type LC impedance matching structure, the matching block 1 may use other matching devices or be implemented in another impedance matching structure.

Next, referring to FIGS. 3 and 4, the power detection circuit of the RF signal amplification circuit forms a coupling circuit with the RF matching inductor 1a of the matching block 1. Further, the power detection circuit detects power by extracting power induced from the RF matching inductor 1a.

At this time, the power detection circuit includes a coupling unit 10, a rectification unit 30, a slope adjustment unit 50, and a smoothing unit 40. Further, in an example, the power detection circuit may further include a biasing unit 20. Detailed descriptions of the power detection circuit will refer to the embodiments of the above-described aspect of the present invention.

For example, the power detection circuit may further include a controller 60. The controller 60 may detect a smoothed DC voltage and then detect power according to a voltage slope using the detected DC voltage.

Further, the RF signal amplification circuit, having a power detection circuit, according to another example will be described with reference to FIGS. 3 and 4. At this time, the RF signal amplification circuit having a power detection circuit may further include the filter block 5. The filter block 5 filters the RF signal output from the matching block 1 to output the filtered RF signal. At this time, the filter block 5 may output the RF signal by removing noise and DC components.

For example, the filter block 5 may include a noise removal capacitor 5b and a DC removal capacitor 5a. At this time, the noise removal capacitor 5b removes high-frequency noises included in the RF signal output from the matching block 1. Further, the DC removal capacitor 5a removes the DC component included in the RF signal to output the DC component removed signal.

According to the embodiments of the present invention, it is possible to be applied to various systems by adjusting the voltage slope for power detection to improve the degree of freedom of the voltage slope for power detection. Further, it is possible to implement delicate coupling by improving the degree of freedom of the voltage slope for power detection.

It is apparent that various effects which have not been directly mentioned according to the various embodiments of the present invention can be derived by those skilled in the art from various constructions according to the embodiments of the present invention.

The above-described embodiments and the accompanying drawings are provided as examples to help understanding of those skilled in the art, not limiting the scope of the present invention. Further, embodiments according to various combinations of the above-described components will be apparently implemented from the foregoing specific descriptions by those skilled in the art. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A power detection circuit comprising:
   a coupling unit adjacent to an RF matching inductor to extract induced power;
   a rectification unit for rectifying a signal output from the coupling unit to output the rectified signal;
   a slope adjustment unit connected between an output terminal of the rectification unit and a ground and adjusting a voltage slope for power detection by changing the output signal of the output terminal of the rectification unit according to changes in internal impedance; and
   a smoothing unit for receiving the output signal of the output terminal of the rectification unit to smooth the received signal into a DC voltage for power detection using the voltage slope.

2. The power detection circuit according to claim 1, wherein the slope adjustment unit has a variable resistor structure.

3. The power detection circuit according to claim 1, wherein the slope adjustment unit comprises a resistor group consisting of a plurality of resistors connected in series and a MOS transistor(s) connected in parallel to each of at least some resistors of the resistor group to vary a resistance of the resistor group.

4. The power detection circuit according to claim 1, further comprising:
   a biasing unit for biasing the signal output from the coupling unit to provide the biased signal to the rectification unit.

5. The power detection circuit according to claim 4, wherein the biasing unit comprises:
   a voltage division unit for dividing a reference voltage; and
   a voltage drop unit for generating a bias voltage by dropping the voltage divided by the voltage division unit, wherein the voltage drop unit drops an RF minimum input signal extracted by the coupling unit so that the smoothing unit output a predetermined DC voltage.

6. The power detection circuit according to claim 1, wherein the coupling unit comprises a coil adjacent to the RF matching inductor to extract the power induced from the RF matching inductor and a termination resistor connected to a termination of the coil to adjust a coupling impedance.

7. The power detection circuit according to claim 6, wherein the coil is formed to overlap in a vertical direction while being separated from an outer eddy conductive line of the RF matching inductor having an eddy structure.

8. The power detection circuit according to claim 6, further comprising:
   a blocking capacitor formed between the coupling unit and the rectification unit to block a DC component of a signal extracted by the coil.

9. The power detection circuit according to claim 1, further comprising:
   a controller for detecting the smoothed DC voltage and detecting power according to the voltage slope using the detected DC voltage.

10. The power detection circuit according to claim 2, further comprising:
    a controller for detecting the smoothed DC voltage and detecting power according to the voltage slope using the detected DC voltage.

11. The power detection circuit according to claim 4, further comprising:
    a controller for detecting the smoothed DC voltage and detecting power according to the voltage slope using the detected DC voltage.

12. The power detection circuit according to claim 6, further comprising:
    a controller for detecting the smoothed DC voltage and detecting power according to the voltage slope using the detected DC voltage.

13. An RF signal amplification circuit, having a power detection circuit, comprising:
    an amplification block for receiving an RF signal to amplify the RF signal;
    a matching block comprising an RF matching inductor and performing impedance matching of the RF signal amplified by the amplification block to output the impedance-matched signal; and
    the power detection circuit according to claim 1, which forms a coupling circuit with the RF matching inductor of the matching block the coupling unit and detects power by extracting power induced from the RF matching inductor.

14. The RF signal amplification circuit according to claim 13, wherein the slope adjustment unit of the power detection circuit has a variable resistor structure.

15. The RF signal amplification circuit according to claim 13, wherein the power detection circuit further comprises a biasing unit for biasing the signal output from the coupling unit to provide the biased signal to the rectification unit.

16. The RF signal amplification circuit according to claim 13, wherein the coupling unit of the power detection circuit comprises a coil adjacent to the RF matching inductor to extract the power induced from the RF matching inductor and a termination resistor connected to a termination of the coil to adjust a coupling impedance.

17. The RF signal amplification circuit according to claim 13, wherein the power detection circuit further comprises the controller for detecting a smoothed DC voltage and detecting power according to a voltage slope using the detected DC voltage.

18. The RF signal amplification circuit according to claim 13, wherein the matching block comprises:
    a first matching inductor connected to an output terminal of the amplification block;
    a second matching inductor as an RF matching inductor connected to the first matching inductor and coupled to the coupling unit of the power detection circuit; and
    a matching capacitor connected between a ground and a node between the first and second matching inductors.

19. The RF signal amplification circuit according to claim 18, further comprising:
    a filter block comprising a noise removal capacitor for removing high-frequency noise included in the RF signal output from the matching block and a DC removal capacitor for removing a DC component included in the RF signal to output the DC component removed signal.

\* \* \* \* \*